United States Patent [19]

Roy et al.

[11] Patent Number: 4,772,759
[45] Date of Patent: Sep. 20, 1988

[54] VENTILATED SPLASH RESISTANT ELECTRICAL COMPONENT HOUSING

[75] Inventors: Dhirendra C. Roy, Canton; Paul J. Brzyski, Rochester; John A. Salerno, Westland, all of Mich.

[73] Assignee: United Technologies Automotive, Inc., Dearborn, Mich.

[21] Appl. No.: 100,160

[22] Filed: Sep. 23, 1987

[51] Int. Cl.⁴ .............................................. H05K 7/20
[52] U.S. Cl. .............................. 174/17 VA; 174/52 R; 361/383
[58] Field of Search ................ 220/27, 367; 98/1; 174/50, 52 R, 17 VA; 361/380, 383, 384, 386

[56] References Cited

U.S. PATENT DOCUMENTS

| | | | |
|---|---|---|---|
| 2,038,075 | 4/1936 | Edwards | 247/1 |
| 2,284,644 | 6/1942 | Dubilier | 200/67 |
| 2,662,109 | 12/1953 | Tapp et al. | 174/52 |
| 3,773,992 | 11/1973 | Mune | 200/144 R |
| 3,900,700 | 8/1975 | Gaudet | 174/17 VA |
| 3,973,477 | 8/1976 | Jakob et al. | 174/17 VA |
| 4,019,005 | 4/1977 | Michetti | 200/144 R |
| 4,050,093 | 9/1977 | Crall et al. | 361/383 |
| 4,203,084 | 5/1980 | Yamaguchi et al. | 335/202 |
| 4,427,863 | 1/1984 | Fujita | 200/306 |
| 4,654,470 | 3/1987 | Feldman et al. | 174/50 |
| 4,707,563 | 11/1987 | Conrad et al. | 174/50 |
| 4,709,123 | 11/1987 | Yamashita et al. | 174/17 VA |

Primary Examiner—G. P. Tolin
Assistant Examiner—David A. Osborn

[57] ABSTRACT

A ventilated, splash-resistant electrical component housing assembly adapted to allow free flow of air throughout the housing assembly in order to provide cooling of electrical components therein. A main housing body (2) having a plurality of openings (12) along with means to retain electrical components (4) with the main body is disclosed. A top cover (30) having exterior notches (42) and an interior wall (46) with interior notches (48) is attached to the main body (2) and a bottom cover (14) having vent channels (19) is secured to the main body (2) in order to shield the electrical components and simultaneously to allow the free flow of air throughout the housing assembly.

7 Claims, 5 Drawing Sheets

VENTILATED SPLASH RESISTANT ELECTRICAL COMPONENT HOUSING

CROSS REFERENCE TO RELATED APPLICATION

This application relates to commonly assigned copending U.S. patent application Ser. No. 100,155 for Electrical Terminal Receptacle and Electrical Component Housing Adapted for the Same.

TECHNICAL FIELD

The field of art to which this invention pertains is electrical component housings, which may contain fuse devices and relays, and which are particularly suitable for use with electrical power distribution networks in automobiles.

BACKGROUND ART

Power distribution boxes are commonly used in the automotive industry to house fuse and relay devices that are necessary to protect or perform various functions in a motor vehicle electrical power distribution network.

When a motor vehicle is in operation, various electrical current demands may be placed upon the electrical components located within the power distribution box with the result that the electrical components act as heat sources of varying output when current passes through them. A considerable amount of heat may be collectively generated by the numerous components located inside the power distribution box, and the heat thus generated within the power distribution box must be dissipated, the corresponding steady state temperatures of the interior of the box must be kept below a temperature level which might cause any of the electrical components to fail. Furthermore, the power distribution box itself may suffer damage due to excessively high temperatures if the steady state temperature within the box is not maintained within a certain range.

Power distribution boxes are often located in the engine compartment of a motor vehicle. The surrounding air within the engine compartment can be expected to reach relatively high temperatures while the engine runs; thereby the potential for high steady state temperatures within the power distribution box is increased. In addition to the higher operating temperatures that are commonly encountered in the engine compartment, water and other liquids may be splashed about the engine compartment and come into contact with the power distribution box. Hence, there is a need to provide a power distribution box that can dissipate heat in an improved manner compared to the current state of the art and simultaneously protect the electrical elements located within the box from contact with undesirable substances.

DISCLOSURE OF THE INVENTION

An object of this invention is to provide an electrical component housing which has the ability to dissipate heat from the interior of the housing in an improved way, and yet shields the components located in the housing, even if the housing is located in a harsh environment such as where high temperatures are expected and where undesirable substances are likely to be splashed onto the housing.

Another object of the invention is to provide an electrical component housing having the above characteristics which is particularly suitable for use in motor vehicle electrical power distribution networks.

The above objects are achieved according to a preferred embodiment of the invention which includes a ventilated and simultaneously splash-resistant electrical component housing suitable for use as a power distribution box wherein the main body is constructed to receive electrical components such as fuses or relay devices. The main body has a plurality of openings located along the bottom panel of the housing to allow cool air to flow through the main housing. In addition, the housing may be constructed so as to have openings to receive electrical components and, if the openings are not used to retain electrical components, cooling air may flow through these openings. The openings which are specifically designed to allow airflow may be located along the top and/or the bottom of the main body. These openings may be placed so as to align with other openings and vents in the covers that will be described below. A bottom cover is secured to the bottom of the main body in order to protect the electrical components that are housed in the main body. The cover may be of unitary construction and includes features or means for fastening the bottom cover to the main body in such a manner that allows a seal between the mating portions of the main body and the bottom cover, yet can easily be unfastened to gain access to the main body for servicing the components located therein.

The vents may be in the form of openings or vent channels which may be flush with the internal and external faces of the bottom cover, or the openings or vent channels may project from one or both faces of the bottom cover if desired. The vent channels may form direct passageways extending between an exterior portion and an interior portion of the bottom cover, or they may form serpentine passageways so as to form indirect passages through the bottom cover. The vent channels may also be positioned at an angle to the bottom cover to accommodate specific needs of the housing.

A top cover is secured at the top of the main body in order to protect the electrical components in the housing. The cover may be of unitary construction including a portion for fastening the top cover to the main body that allows a seal between the mating portions of the main body and the top cover. As with the bottom cover, the top cover should be secured in a manner that allows a service person to easily unfasten the top cover from the main body to gain access for servicing the components therein. A plurality of exterior notches for venting may be located along any of the external edges of the top cover exterior portion. A notched interior wall is located proximate to the edges or the exterior portions of the top cover having the exterior notches. The interior and exterior notches that are proximate to each other are purposely offset from each other to form an indirect passage to the inside of the main body. The interior wall has partitions extending to and joining the top cover ceiling with the exterior wall. The partitions act to separate the exterior notches from each other and to separate the interior notches from each other thereby strengthening the interior wall and further providing an even less direct passage into the inside of the housing assembly. The interior wall may be parallel to the front of the top cover and may be positioned in a vertical manner, or in an inclined manner depending on the anticipated direction of splashes and the relative orientation of the housing assembly. A free stepped edge of the interior wall mates with the main body so as to provide a plurality of openings to further enhance the airflow through the interior and exterior notches and also the overall circulation of air throughout the housing assembly.

The foregoing and other features and advantages of the present invention will become more apparent from the following description of the drawings and appended claims.

BEST MODE FOR CARRYING OUT THE INVENTION

Figure 1:
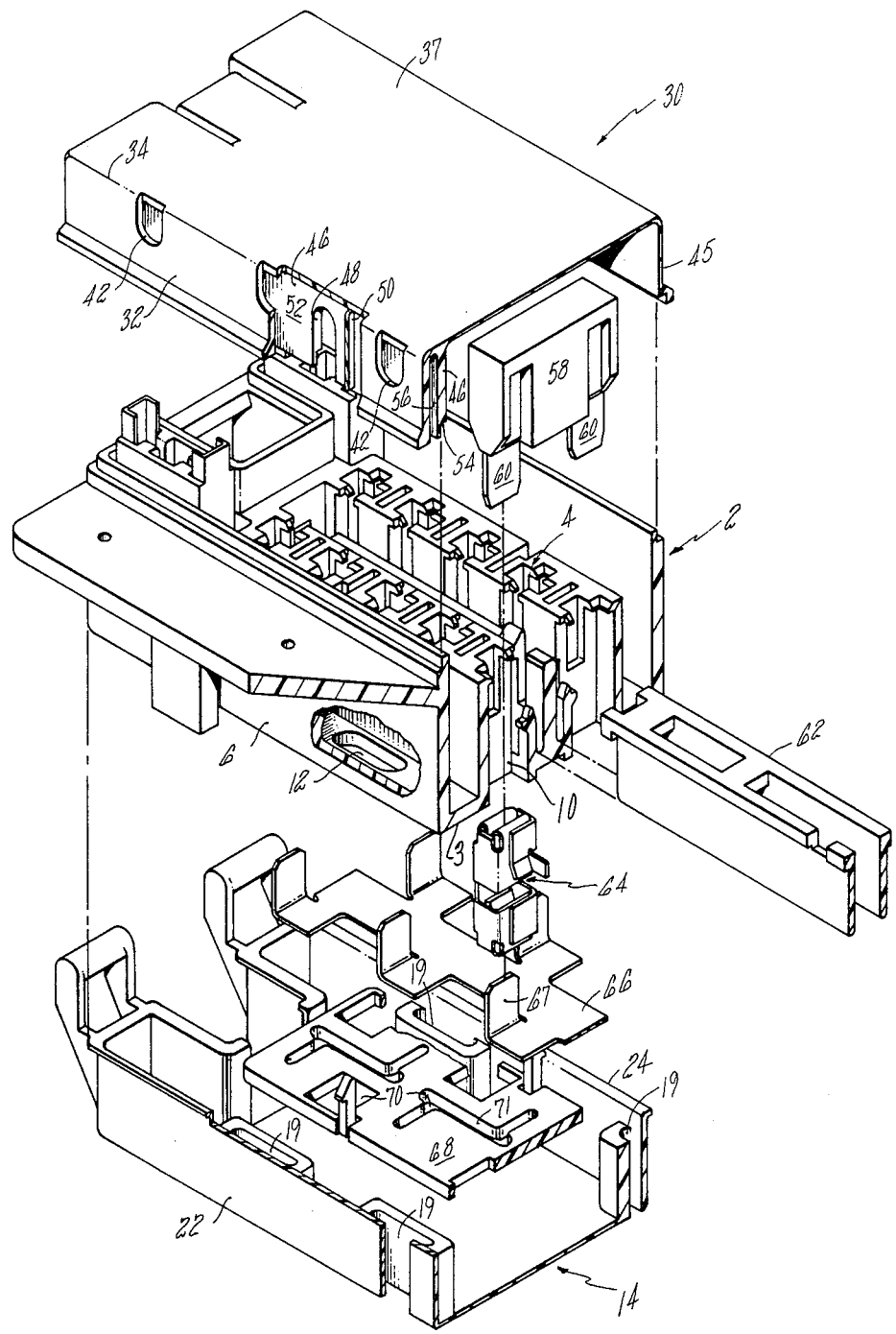
FIG. 1 is an exploded perspective view, partially broken away and partially sectioned, of an embodiment of the ventilated splash resistant electrical component housing assembly.
Figure 2:
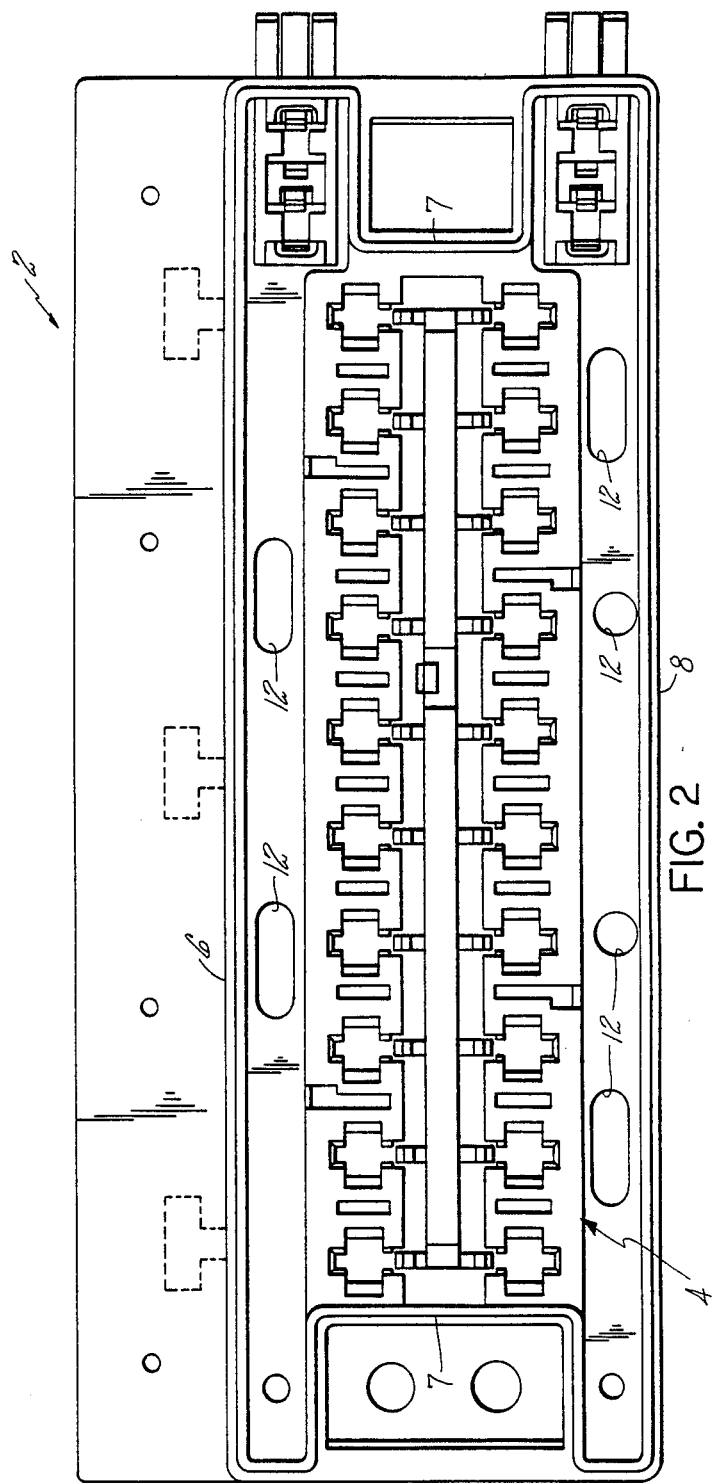
FIG. 2 is a top view of the main body.
Figure 3:
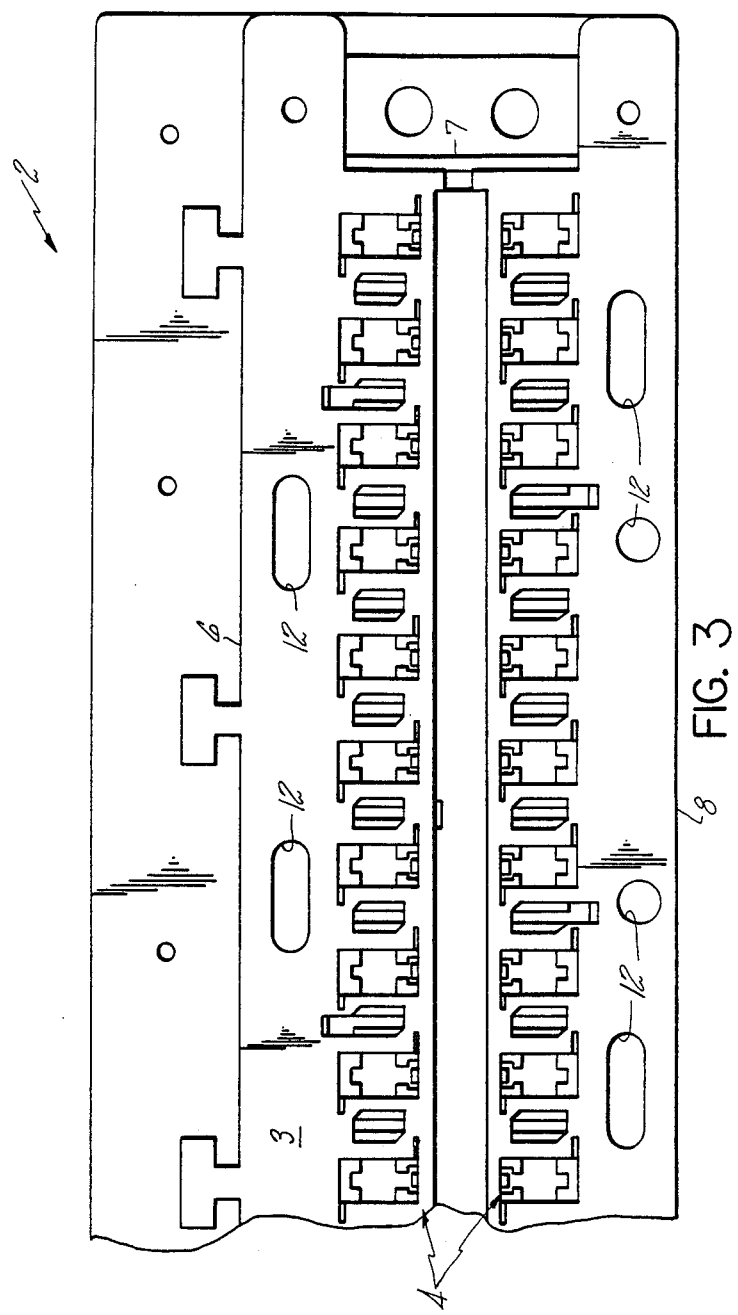
FIG. 3 is a bottom view of the main body.

Referring now to the drawings, an embodiment of a ventilated, splash-resistant electrical component housing molded from a rigid plastic material is illustrated in FIG. 1. The invention includes a generally rectangular main housing body 2 defined by bottom panel 3 shown in FIGS. 1 and 3, being perpendicular and attached to both rear panel 6 and front panel 8, of which rear panel 6 and front panel 8 are in opposition to each other. Attached opposing side panels 7 complete generally rectangular main body 2. Main housing body 2 also includes means for retaining electrical components (matrix 4) therein. A plurality of openings 12 are located in bottom panel 3 for the purpose of allowing air to pass through bottom panel 3.

Included in FIG. 1 is a fuse 58 having blade terminals 60 that are to be received by a previously inserted receptacle 64. Receptacle 64 is retained within cavities 10 of main body 2. Locking bar 62 when engaged with main body 2 provides additional means for securing the receptacles within cavities 10. Bus bar 66 transmits electrical current to preselected receptacles 64 via terminals 67 which are received by receptacles 64. Bus bar insulator 68 prevents bus bar 66 from coming into contact with objects that may cause an electrical short circuit. Bus bar insulator 68 has a plurality of openings 70 for allowing terminals connected to insulated wires (not shown) to pass through.

A generally rectangular bottom cover 14 (shown in FIG. 5) mates with main body 2 and includes bottom panel 16, which further has external bottom panel face 18 on one side and internal bottom panel face 20 on the other side. Bottom panel 16 of bottom cover 14 is perpendicular to and attached to rear bottom cover panel 22 and front bottom cover panel 24, wherein panel 22 and panel 24 are in opposition to each other. Attached opposing bottom cover side panels 25 complete generally rectangular bottom cover 14. Internal edges 26 are located along the top of the rear bottom cover panel 22 and along the top of the front bottom cover panel 24 and mate with main body 2. Main body 2 and bottom cover 14 have cooperating means for securing (not shown) bottom cover 14 to main body 2.

Figure 4:
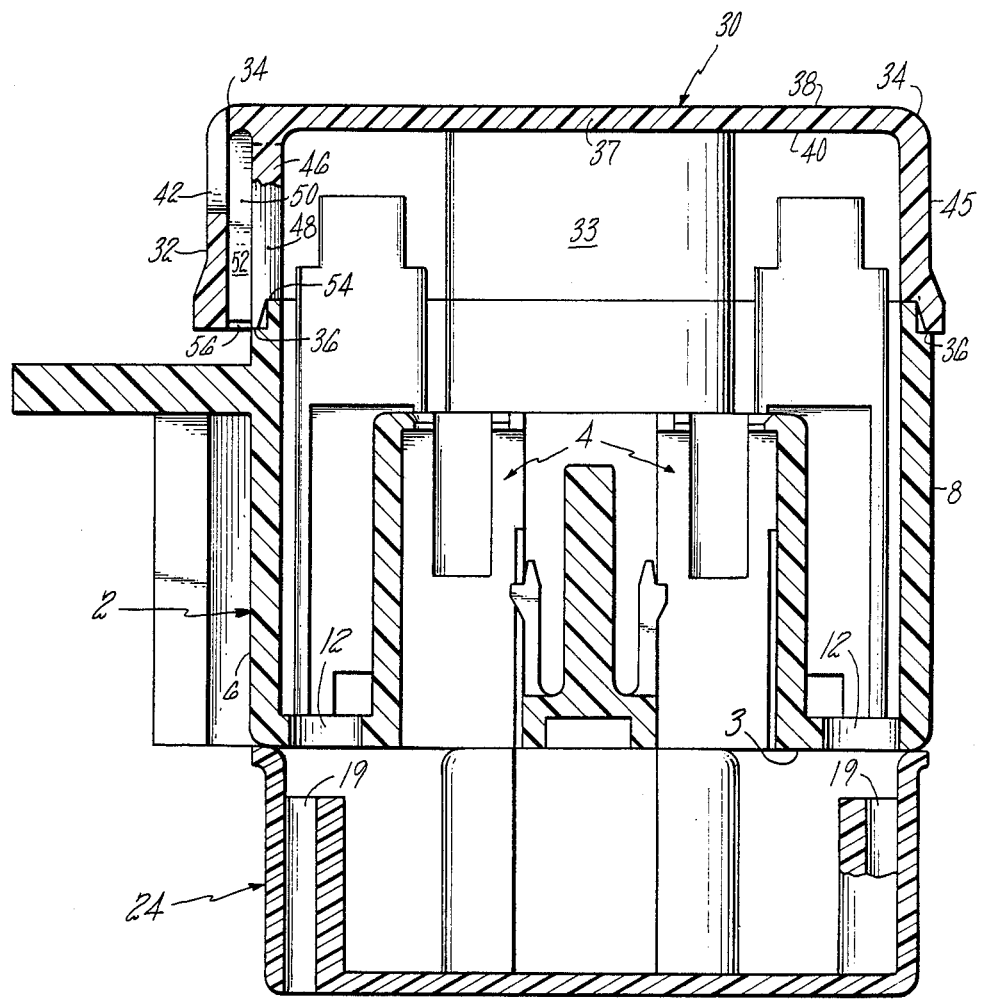
FIG. 4 is a sectioned end view of the component housing.

FIGS. 1 and 4 show elongated vent channels 19 being located in bottom cover 14. Elongated vent channels 19 allow air to pass through bottom cover 14 yet are positioned so as not to become obstructed by any insulated wires (not shown) that may be nested between main body 2 and bottom cover 14.

A generally rectangular top cover 30 shown in FIGS. 1 and 4 mates with main body 2 and includes rear top cover panel 32 which is perpendicular and attached to top cover panel 37. Top cover panel 37 has a top cover external face 38 and a top cover internal face 40. Front top cover panel 45 is perpendicular and attached to top cover facing 37 so as to be opposing rear top cover panel 32. Attached opposing top cover side panels 33 complete generally rectangular top cover 30. Internal edges 36 are formed where e.g., rear top cover panel 32 joins top cover internal face 40, and external edges 34 are formed where e.g., rear top cover panel 32 joins top cover external face 38. Main body 2 and top cover 30 have cooperating means for securing (not shown) top cover 30 to main body 2.

A plurality of exterior notches 42 located in the rear top cover panel 32 extend from external edge 34 and terminate in rear top cover panel 32. FIG. 1 shows an interior wall 46 which extends perpendicularly from top cover internal face 40 and parallels rear top cover panel 32. A plurality of interior notches 48 are located in interior wall 46 and terminate at the free stepped edge of interior wall 54 shown in FIGS. 1 and 4. Partitions 50 shown in FIGS. 1 and 4 extend perpendicularly from interior wall 46 and join rear top cover panel 32 to interior wall 46. Partitions 50 add structural rigidity to top cover 30. Furthermore, partitions 50 are positioned to separate interior notches 48 from each other and also to separate exterior notches 42 from each other, interior notches 48 being staggered with respect to exterior notches 42 thus forming splash-resistant passages 52 which contain at least one exterior notch 42 and at least one interior notch 48.

Free stepped edge 54 of interior wall 46 nests with rear main body panel 6 to form downward facing openings 56 which enhance airflow through the housing assembly while still maintaining liquid splash resistance.

The top cover may have exterior notches and a corresponding interior wall similar to interior wall 46, and interior notches along with the other features described located along any external edge of the top cover.

Figure 5:
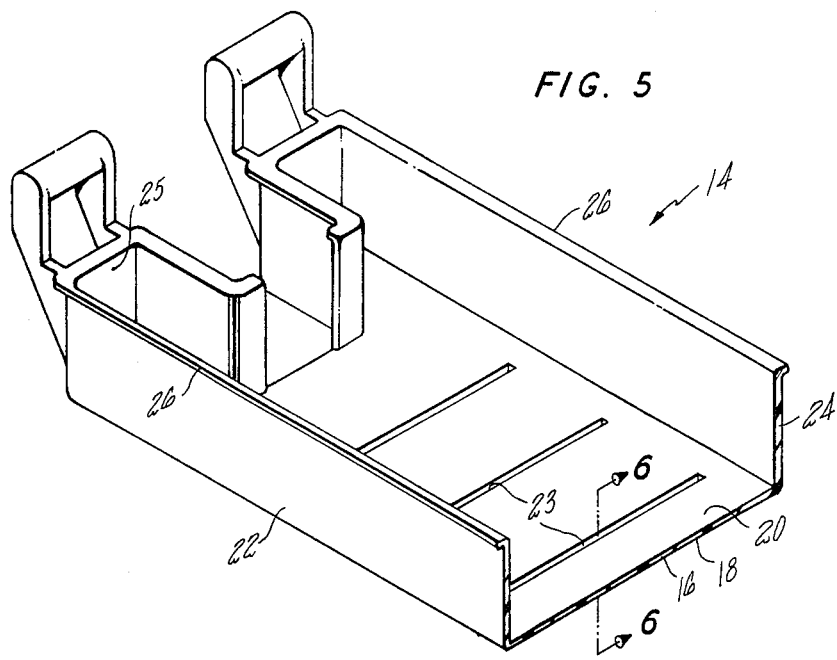
FIG. 5 is a sectioned perspective view of an embodiment of the bottom cover of the housing.
Figure 6:
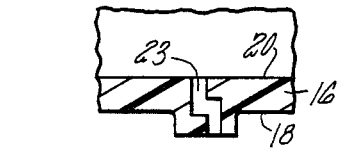
FIG. 6 is a typical section view of a bottom cover employing a serpentine vent in the direction shown by the section line 6—6 in FIG. 5.
Figure 7:
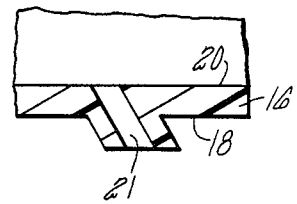
FIG. 7 is a typical section view of a bottom cover employing an angled vent in the direction shown by section line 6—6 in FIG. 5.

FIG. 5 illustrates another embodiment of bottom cover 14. Elongated vent channels 19 have been replaced by serpentine vent channels 23, located in bottom panel 16 of bottom cover 14 shown in section in FIG. 6 in the direction of section line 6—6 in FIG. 5. Alternatively, angled vent channels 21 (FIG. 7) may be positioned in the same manner as serpentine vent channels 23 previously described. A sectional view of an angled vent channel 21 is shown in FIG. 7.

Both serpentine vent channels 23 and angled vent channels 21 are flush with internal bottom cover face 20 and project from external bottom cover face 18 so as to allow insulated wires to be accommodated between main body 2 and bottom cover 14. The orientation of the vent channels in bottom cover 14 are determined by anticipating the most likely direction in which splashed liquids would contact the housing assembly.

Combining elongated vent channels 19 with serpentine vent channels 23, angled vent channels 21, or both may be desired if extremely high operating temperatures are expected to be generated within the component housing while in service.

In order to cool the electrical components, including receptacles and mating terminals located within the housing assembly, air flows through elongated vent channels 19, circulates between bottom cover 14 and main body 2, then passes through openings 12, 70, and 71 to circulate between top cover 30 and main body 2, finally the now heated air exits the housing assembly through exterior notches 42. As the heated air escapes, relatively cold air is drawn in, and thus the circulation process continues.

The invention allows airflow through the housing, yet shields the electrical components from liquids that may be splashed about in an engine compartment.

Although the invention has been shown and described with respect to detailed embodiments thereof, it will be understood by those skilled in the art that various changes in the form and detail thereof may be made without departing from the spirit and scope of the invention.

We claim:

1. A ventilated, splash-resistant electrical component housing assembly adapted to allow free flow of air throughout the housing in order to provide cooling of electrical components within the housing comprising:
   (a) a rectangular main body having means for retaining electrical components therein, the main body having a bottom panel, a rear panel, a front panel, and a plurality of openings which are located in the bottom panel near at least one of the front panel or the rear panel to allow airflow through the bottom panel of the main body;
   (b) a unitary rectangular bottom cover including a bottom panel having external and internal bottom panel faces, rear and front bottom cover panels, both of which have internal edges, means for securing the bottom cover to the main body, and means for venting the bottom panel of the bottom cover;
   (c) a unitary rectangular top cover including a top cover panel having external and internal edges, top cover external and internal faces, a plurality of exterior notches located along the external edge of the rear of the top cover panel and terminating short of the internal edge of the rear top cover panel, and means for securing the top cover to the main body; and
   (d) an interior wall located parallel and proximate to the rear of the top cover panel, the interior wall having a plurality of interior notches which are staggered with respect to the exterior notches and wherein said interior notches terminate short of the internal face of the top cover, the interior wall being joined to the rear of the top cover panel by a plurality of partitions positioned to separate the interior notches from each other and also to separate the exterior notches from each other thereby forming splash-resistant passages that in conjunction with the vent means located in the bottom cover allow for the free convection of air throughout the housing assembly.

2. The apparatus as set forth in claim 1 wherein the means for venting the bottom panel of the bottom cover comprises a plurality of elongated vent channels located adjacent to and along at least one of the rear and front bottom cover panels, said vent channels being flush with the external face, projecting perpendicularly from the internal face and terminating short of the internal edges of the rear and front bottom cover panels.

3. The apparatus as set forth in claim 1 wherein the means for venting further comprises a plurality of vent channels located adjacent to and along at least one of the rear and front bottom cover panels, the said vent channels protruding from the external face at an angle therefrom, the vent channels terminating short of the internal edges of the rear and front bottom cover panels.

4. The apparatus as set forth in claim 1 wherein the means for venting comprises a plurality of vent channels located adjacent to and along at least one of the rear and front bottom cover panels, the said vent channels having a serpentine passageway extending between an exterior portion and an interior portion so as to form an indirect passage through the bottom cover.

5. The apparatus as set forth in claim 1 wherein the unitary rectangular top cover further comprises:
   (a) a plurality of exterior notches located along at least one external edge of the top cover and extending past that external edge into the rear top cover panel;
   (b) an interior wall located parallel to the rear top cover panel and inclined toward the top cover internal face and terminating below the notches located in the rear top cover panel.

6. The apparatus as set forth in claim 1 wherein the top cover further comprises:
   (a) a front top cover panel having external and internal edges;
   (b) a plurality of front exterior notches located along the external edge of the front top cover panel and terminating short of the internal edge of the front top cover panel; and
   (c) an interior wall located parallel and proximate to the front top cover panel, the interior wall having a plurality of front interior notches which are in misalignment with the front exterior notches, wherein said interior notches terminate short of the internal face of the top cover, the front interior wall being joined to the front top cover panel by a plurality of bottom partitions positioned to separate the front interior notches from each other and also to separate the front exterior notches from each other.

7. The apparatus as set forth in claim 1 wherein the top cover comprises:
   an interior wall having a free stepped edge which mates with at least one of the front and rear panels of the main body that, in conjunction with at least one of the the front or rear panels of the top cover forms inwardly-facing openings, thereby enhancing the free convection of air throughout the housing assembly.

* * * * *